United States Patent [19]
Dierschke et al.

[11] Patent Number: 5,567,976
[45] Date of Patent: Oct. 22, 1996

[54] POSITION SENSING PHOTOSENSOR DEVICE

[75] Inventors: Eugene G. Dierschke, Dallas; John H. Berlien, Jr., Plano, both of Tex.

[73] Assignee: Texas Instruments Incorporated, Dallas, Tex.

[21] Appl. No.: 433,304

[22] Filed: May 3, 1995

[51] Int. Cl.$^6$ ................................. H01L 31/00
[52] U.S. Cl. .................. 257/443; 257/448; 257/459; 257/465; 257/466; 250/206.1; 250/206.2; 250/206.3; 250/208.6
[58] Field of Search ................... 257/465, 459, 257/443, 448, 462, 797, 446, 466; 250/208.6, 206.2, 206.1, 206.3

[56] References Cited

U.S. PATENT DOCUMENTS

| | | | |
|---|---|---|---|
| 4,976,538 | 12/1990 | Ake | 250/206.1 |
| 5,162,887 | 11/1995 | Dierschke | 257/465 |
| 5,444,234 | 8/1995 | Hennerici et al. | 250/206.2 |

FOREIGN PATENT DOCUMENTS

| | | | |
|---|---|---|---|
| 3625643 | 2/1988 | Germany | 250/206.1 |
| 1042410 | 6/1989 | Japan | 250/208.6 |
| 4111480 | 4/1992 | Japan | 257/443 |

OTHER PUBLICATIONS

Optoelectronics Data Book for Design Engineers, Texas Optoelectronics, Inc., 1988.

*Primary Examiner*—William Mintel
*Attorney, Agent, or Firm*—Gary Honeycutt; René Grossman; Richard Donaldson

[57] ABSTRACT photosensor device (41) having tapered photodiodes (53, 55) that are interdigitated and which is compatible with typical ASIC, CMOS and BiCMOS processes. A left side photodiode array of tapered regions (53) of a first conductivity type is disposed into an epitaxial layer of a second conductivity type. This array of photodiodes is coupled together and further coupled to a first output terminal (43). A fight side photodiode array of tapered regions (55) of said first conductivity type is disposed into the epitaxial layer of the second conductivity type, spaced apart from the left side photodiode by a minimum distance. A second output terminal is coupled to the array of fight side photodiodes (51). An incident light spot (39) is focused onto the sensor. The amount of current generated at the first and second output terminals (43, 51) will be proportional to the area of the left photodiode array and the area of the fight photodiode array which is receiving light. By comparing the current generated at the first and second output terminals, the position of the incident light spot can be accurately measured as a percentage of the total width of the sensor. The photosensor (41) may be used in many applications but is particularly well suited to autofocusing systems. Several embodiments are described which vary the size and number of photodiodes used. An integrated circuit (123) which incorporates the photosensor with the circuitry needed to output a digital position measurement is described.

14 Claims, 4 Drawing Sheets 5,567,976

POSITION SENSING PHOTOSENSOR DEVICE

FIELD OF THE INVENTION

This invention relates generally to position sensitive detectors that use photosensors for detecting the relative position of a spot of light, integrated circuits for position sensing applications, and light detection circuitry for a variety of applications such as automatic focusing, position sensing, photocopiers, facsimile machines, automatic lighting systems, data communications. The invention relates specifically to the design of position sensing integrated circuits including photosensitive sensors and the associated circuitry for producing automatic focusing systems.

BACKGROUND OF THE INVENTION

In the autofocusing systems of the prior art, photodiodes are arranged as position sensitive detectors (hereinafter PSDs). A spot of light is directed at the subject being photographed, videographed or located, and the PSD receives a reflected light spot. The PSD generates current that is used to develop a linear position value. Typically, the PSD is a rectangularly shaped PN junction device with two output electrodes, one at each end of the rectangle.

FIG. 1 depicts an example of a prior art PSD photosensor 1. Contact 9 couples output terminal I1 to the left end of a p type semiconductor layer 3. Contact 11 couples output terminal I2 to the right end of p type semiconductor layer 3. The p type layer 3 is spaced apart from the n type semiconductor layer 5 that makes up the N part of the PN junction. A high resistivity Silicon substrate material 7 lies between the p type layer 3 and the n type layer 5. The n type layer 7 is coupled to a ground or common terminal.

In operation, when a spot of incident light strikes the photosensor of FIG. 1, the device outputs two currents at the output terminals I1 and I2. The incoming photons produce electron-hole pairs in the p type layer 3, which then migrate across the substrate 7 and into the n type layer 5, producing current. The electron hole carriers are quite mobile and will usually migrate large distances without recombination. The current produced by the incident photons is split into two output currents, I1 and I2. The level of current at each output is inversely proportional to the distance from the output terminal I1 or I2 to the spot of incident light. Current at terminal I1 is at a maximum when the spot is closest to I1, which occurs when the distance from I1 to the spot is zero. Similarly, the current output at terminal I2 is maximum when the distance from terminal I2 to the spot is zero. By comparing the two currents I1 and I2, it is then possible to generate a linear position value for the spot of light focused onto the photosensor. Typically the output is expressed as a distance which is proportional to the distance of the light spot from one end of the sensor. Position sensitive detectors using this approach are currently available from Hamamatsu, part no. S3271, and Toshiba, part no. TPS 710, as only two examples.

The prior art PSD of FIG. 1 uses a common terminal at the n-type layer, which is contacted at the backside of the device. It also requires a special high resistivity silicon substrate. These characteristics make it incompatible with the state of the art semiconductor processes used to produce CMOS or BiCMOS linear and digital circuitry. This incompatible process type means that the photosensor and the other circuitry associated with autofocus systems, such as signal processing functions, control logic, LED drivers, the analog comparator needed to generate the linear position for the spot, and the A/D converter associated with the compare function, must all be placed on another semiconductor device separate from the PSD itself. To produce small, low cost cameras with autofocusing features, it is desirable to place all of the semiconductor components on a single integrated circuit.

Another prior art approach is implemented by Texas Optoelectronics using a bipolar semiconductor process. This PSD was developed for use in surveying equipment and leveling and grade measurement tools. A pair of opposing photodiodes is placed into a rectangular sensor area. The sensor looks like a rectangle that split along a diagonal. Each photodiode is a triangular region of semiconductor material of p or n type, which is formed over a region of the opposing type of semiconductor material to form a P-N or N-P junction. Each photodiode has a single current output terminal at its widest end. The photodiodes are positioned close together along their sloping sides so that at the center of the sensor, incident light hits an equal area of each photodiode. At the ends of the sensor region, the area receiving incident light is large for one photodiode, while the area of the other photodiode which receives incident light is quite small. This occurs due to the triangular shapes of the photodiodes. When a laser spot strikes the pair of triangular areas, two currents are generated. Each of these currents is inversely proportional to the distance of the laser spot from the respective terminal.

However, this prior art bipolar PSD requires that the spot used be of a particular size for accuracy. If the spot has a diameter that is smaller than the width of the rectangle, it may appear to be all incident on one photodiode. The output currents will then erroneously indicate the spot is at the far left or far right of the sensor. In fact the light spot is in another position closer to the center of the sensor. The spot size must therefore be carefully controlled to prevent errors at the outputs. The device is intended for costly surveying and grade measurement equipment, and in that environment the spot size requirement is acceptable; however, it is generally an undesirable limitation. The bipolar device is also not compatible with the CMOS, LinCMOS, and BiCMOS technologies currently used for ASICs and integrated circuitry that provide the associated circuits for the autofocus systems.

The prior art PSD' devices are not compatible with the ASIC semiconductor processes currently used to produce the digital signal processing circuitry, digital circuitry, and linear circuitry required for a complete autofocus system. Accordingly, there is a need for a position sensitive detector that provides a photosensor which can be integrated into these processes so that a complete autofocus system can be produced on a single integrated circuit. The PSD should also be tolerant of a range of spot sizes to reduce the system cost and improve accuracy.

SUMMARY OF THE INVENTION

Generally, and in one form of the invention, a structure and method for a highly accurate position sensitive device (hereinafter PSD) is provided. The PSD of the invention is compatible with CMOS, LinCMOS, BiCMOS and ASIC semiconductor processes without the need for additional masks or process steps, and is tolerant of a variety of incident light spot sizes. This PSD is compatible with the digital and linear circuitry required to provide a complete application circuit on a single IC. This feature makes it ideal for use in low cost, low area systems such as handheld cameras and videography equipment. Although excellent for use in autofocusing cameras, the structure of the invention can also be used in any application which requires a position sensitive detector device. A first plurality of tapered photodiodes having top side contacts is provided, and then a second plurality of similar tapered photodiodes is interdigitated with the first plurality. Each of the tapered sections of the first plurality is coupled together, as is each of the tapered sections of the second plurality, to form two photodiode arrays. Output terminals are coupled to each of the two photodiode arrays. A spot of light is then focussed onto the interdigitated tapered photodiodes. A linear position value is generated by comparing the current generated at the two output terminals. The array of tapered sections will detect spots that are smaller than the spots required by the prior art PSD devices so that the spot size is no longer critical. The PSD device of the invention provides an accurate PSD that is easily integrated onto an integrated circuit that includes other functions required by the system. An example IC is described using the PSD of the invention and including the comparator and analog to digital circuitry required to generate a linear position value in a digital format. The digital processing circuitry and control circuitry required to implement an entire autofocusing system may be integrated onto a single IC. Other embodiments are also described.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
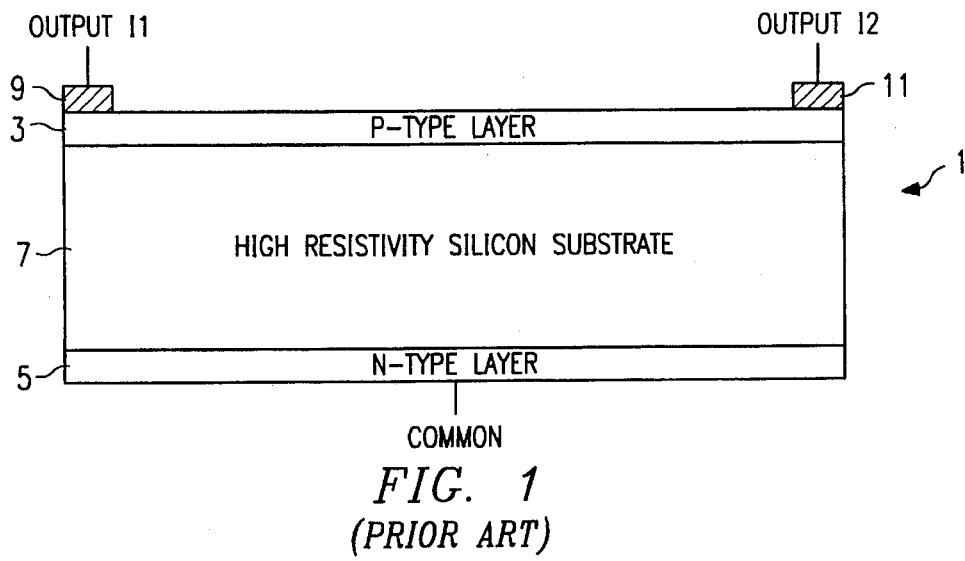
FIG. 1 depicts a prior art PSD device.
Figure 2:
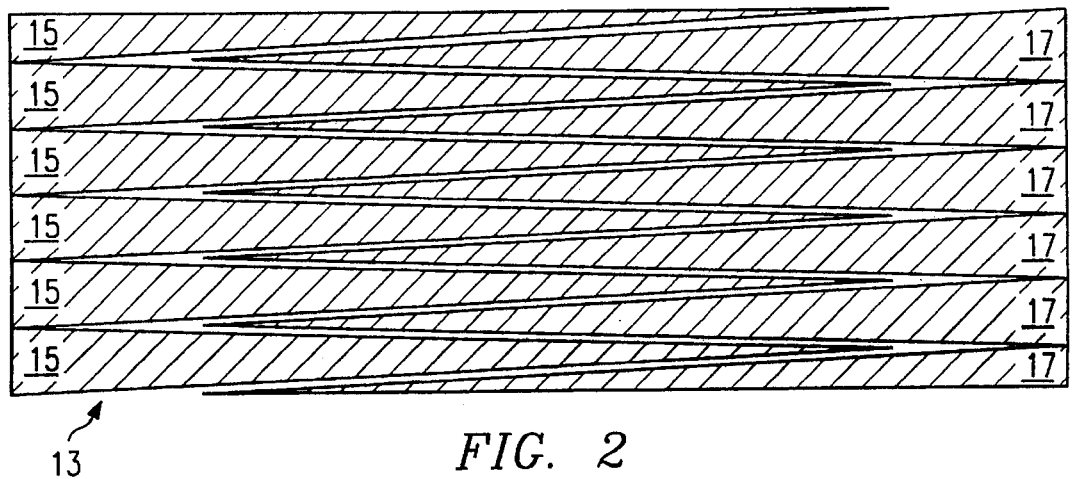
FIG. 2 depicts a top view of the first preferred embodiment of the PSD structure using the invention.

FIG. 2 depicts a plan view of a first preferred embodiment of a position sensitive detector 13 incorporating the structure of the invention. Photosensitive regions 15 are tapered regions of n type material coupled together at the left end to form a left side photodiode. Tapered regions 17 are also formed of an n type material which are coupled together at the right end and form a right side photodiode. The two photodiodes are placed into the rectangular sensor region 13 and are interdigitated, such that a minimal spacing is maintained between them. The spacing is a zigzag in this example, but if the tapers are of different shape, the spacing could be any tortuous shape, or sinuous in shape. Preferably, an opaque material such as first level metal covers the interface spacing between the left and right side photodiodes. The addition of the first level metal over the interface region prevents photons from falling into the space between the tapered regions. This prevents undesirable current in the substrate.

Figure 3:
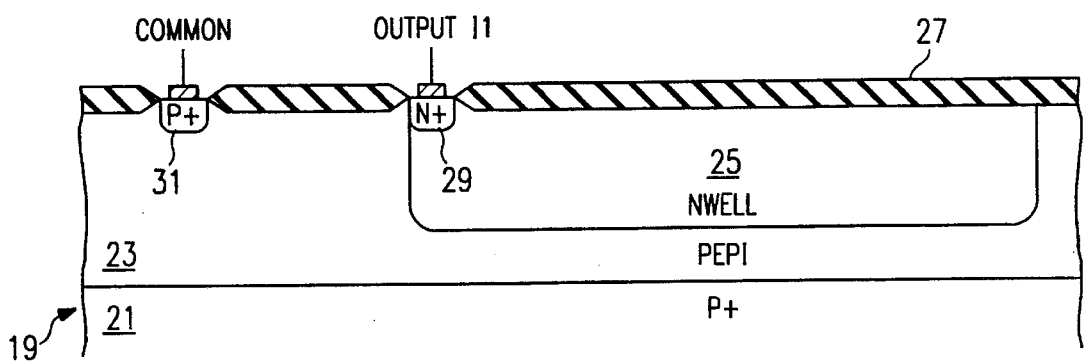
FIG. 3 depicts a cross sectional view of the PSD device of FIG. 3.

FIG. 3 depicts a cross section of a portion of one of the tapered regions of FIG. 2. The cross section is taken along the longitudinal axis of one of the tapers of FIG. 2. The cross section includes an output contact region and the substrate contact. Photodiode 19 is comprised of a semiconductor substrate 21 doped to a conductivity type of P+. P– epitaxial layer 23 is grown over the substrate 21. The tapered photodiode is an N-type well 25 several microns thick in the p-epitaxial layer 23. A thick field oxide 27 is grown over the entire structure to provide passivation for the junction region. Output contact 29 is produced in the N well 25 and an N+ contacting region 29 is implanted to enhance the electrical contact to the N well 25. Similarly, a common contact 31 is produced for the substrate contact to a common voltage.

The photodiode of FIG. 3 may be produced using any number of conventional semiconductor processing methods well known in the art, but in a preferred embodiment is produced as follows. P– epitaxial layer 23 is grown to a thickness of approximately 20 microns, although more or less thickness is an acceptable alternative. The p- epitaxial layer 23 is grown using an impurity to produce a sheet resistance of approximately 7 ohm-cm. N well 25 is formed using an ion implantation technique to implant the dopant. The ion implantation is only one way to produce an N well, other techniques may be used. An anneal and diffusion step follows using a fairly long anneal time to produce a well of approximately 6–7 microns in depth. Silicon nitride is deposited, patterned and etched to mask the areas where contacts 29 and 31 are to be formed. Thick field oxide 27 is now formed. Thermal oxidation techniques such as LOCOS or other methods may be used. After the thick field oxide is produced, the nitride covering areas 29 and 31 is stripped away using conventional means. Thick field oxide 27 is used as a mask, and the contact diffusions are performed to produce the heavily doped contacting regions in areas 29 and 31. First metal is then used to form the contacts 31 and 29. In an actual circuit device, first metal is used to form a large bond pad that contacts the substrate in area 31, which is then used to receive the common terminal bond wire. Similarly, each of the tapered photodiodes is coupled by a first metal conductor bus to a bond pad of first metal which is then used to receive the output terminal bond wire. The left side photodiodes will all be coupled to a single bond pad and to each other, as will the right hand photodiodes.

In operation, each tapered photodiode of FIGS. 2 and 3 operates in the same general manner as the prior art photodiode. As incident light hits the n type material at the surface of the sensor, electron hole pairs are kicked off by the incoming photons. These carriers migrate until they cross the p-n junction between the n-well 25 and the p- epitaxial substrate 23. When the minority carriers cross the junction, current is produced at the output terminals.

Figure 4:
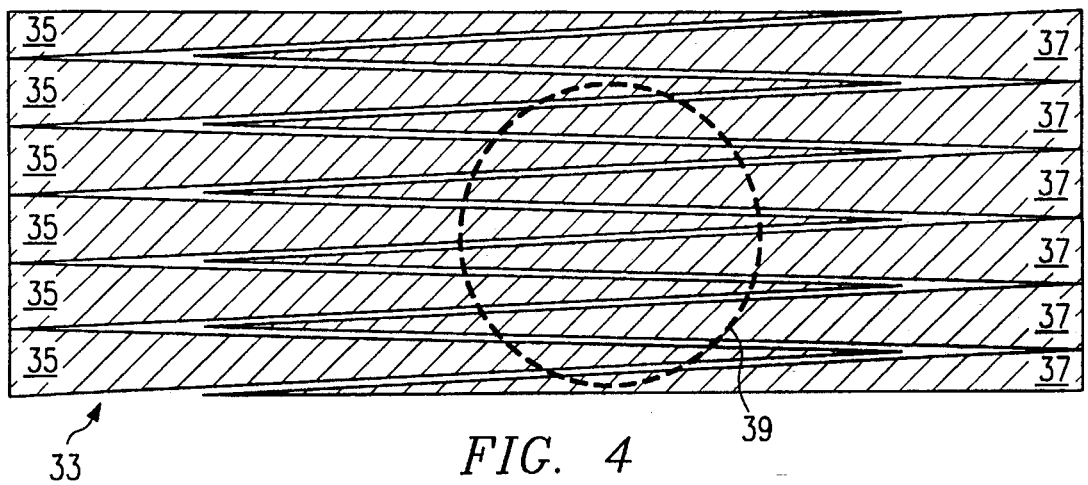
FIG. 4 depicts the operation of a section of the PSD device of FIGS. 3 and 4.

FIG. 4 depicts a plan view of a preferred embodiment sensor incorporating a plurality of the photodiodes of FIGS. 3 and 4. Left hand side photosensor 35 is comprised of a plurality of tapered photodiodes, each constructed as discussed above and all coupled to a single circuit output terminal, which is not shown. Right side photosensor 37 is comprised of a second plurality of tapered photodiodes which are also coupled together to a single circuit output terminal, which is also not shown. An incident light spot 39 which covers less than the total width of the photosensor 35 is shown as an example of a proper sized spot.

In operation, each of the tapered photodiodes in FIG. 4 which lies within the circular area 39 which represents incident light will generate current. The current generated by each tapered region will be proportional to the area of the tapered region which is covered by the light spot 39. Those tapered regions outside the area of the light spot 39 will not generate current. Each of the tapered regions is coupled to the other tapered regions oriented in the same direction, so that the total current at the respective output terminal is proportional to the area of each tapered region receiving incident light which is added to the other tapered regions that make up the left side or right side photosensor. The advantage of the use of the invention can now be seen. If the light spot 39 of FIG. 4 is larger than shown, more regions will produce current, however each side of the sensor will receive the same proportionally increased current. Because the indicated location of the spot is indicated by the difference of the two currents, it will be the same as spot size increases. Similarly, if the spot is smaller than is shown in FIG. 4, the total number of tapered regions which are receiving incident light will be reduced, but again the exposed area which is part of the left side photosensor and the exposed area which is part of the right side photosensor will both be reduced proportionally, so that the indicated location of the spot will still remain accurate. As the light spot gets smaller and smaller, the amount of current produced by the sensor begins to fall off. At some minimal spot size the current is too small to produce reliable results. The spot has an operational minimum size, as well, which is the width of one of the tapered photodiodes at its widest point. If the spot is smaller than this minimum, position errors will occur because the spot could be positioned in the center of the sensor but only hitting one taper area, which results in current only at one of the two circuit output terminals. Current at only one terminal indicates the spot is at one side or the other of the sensor; when in fact in this example it is somewhere else closer to the center. For optimal results, the spot should be about ⅓ to ½ of the total sensor area, but larger and smaller spots will work without error until the current out of the device falls off, as described above.

Figure 5:
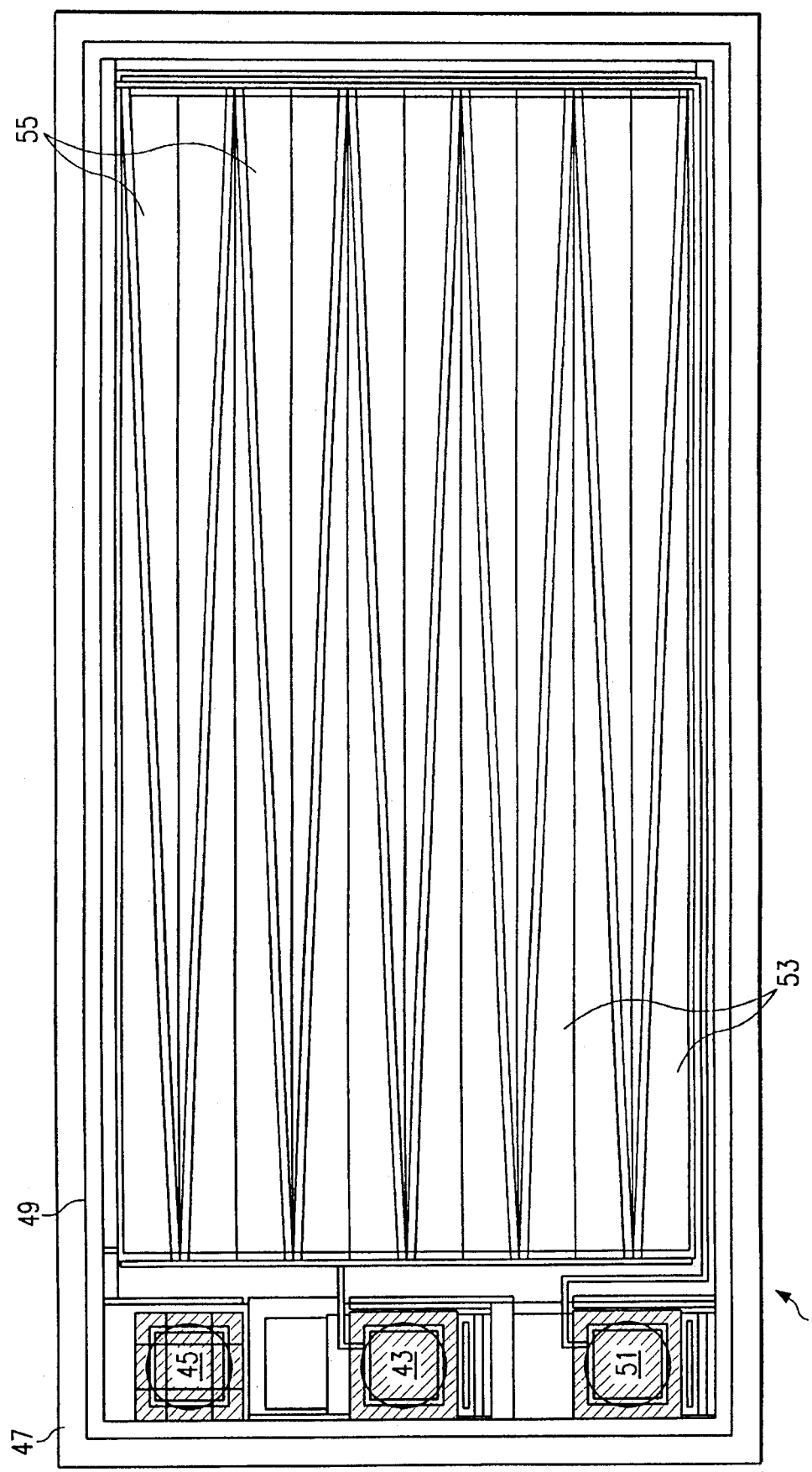
FIG. 5 depicts a plan view of a sensor circuit including the device of FIG. 4.

FIG. 5 depicts an integrated circuit implementing another preferred embodiment photosensor. Left hand side photodiodes 53 are formed as tapered photodiodes of a N material using N wells. These photodiodes are coupled together at their bases and are then coupled to bond pad 43 using first level metal. Similarly, right hand side photodiodes 55 are formed of an N type material. These tapered photodiodes are interdigitated with, and spaced apart from, the left hand photodiodes. A first metal bus is coupled to the base of each of the right hand photodiodes 55 and to the bond pad 51. Bond pad 45 is coupled to a first metal bus which forms a common contact to the P epitaxial layer and which runs along the sides of the photosensor area. Area 47 is a dummy N type photosensor which forms the edge of the device and is coupled to the substrate. Dummy photosensor 47 collects light in areas outside the photosensor along the scribe lines for the integrated circuit. The resulting carriers are coupled to the substrate to prevent errors that would otherwise be caused by additional carriers. The edge of the integrated circuit 49 is covered with second or third level metal which is not coupled to anything. This metal is isolated from the first level metal, and is used to block unwanted photons from the substrate, which could cause erroneous readings due to the generation of carriers outside the photosensor areas. All areas of the device which could collect carriers, and which are outside the photodiode areas, are preferably with an opaque material. An unused metal layer is an excellent choice for this material. The tortuous area between the left and right side photodiodes 53 and 55 is also covered with either first, second or third level metal to prevent unwanted photons from entering the substrate. The area between the bond pads and the photodiodes is also covered with an opaque material, such as second or third level metal.

In operation, the ten taper photosensor of FIG. 5 operates exactly in the manner described above with respect to FIG. 4. A current is developed at both bond pads 43 and 51 which is proportional to the amount of area covered by incident light for the respective left hand or right hand photodiode array. The currents can be compared to determine what percentage of the total distance from the end a light spot is located. Because the areas of the tapered photodiodes are larger at the ends, the current developed is inversely proportional to the distance from the end of the respective photodiode. Again, to prevent position errors the light spot should be at least as wide as the widest part of one taper. For accurate operation the light spot is preferably at least one third of the area of the photosensor.

Figure 6:
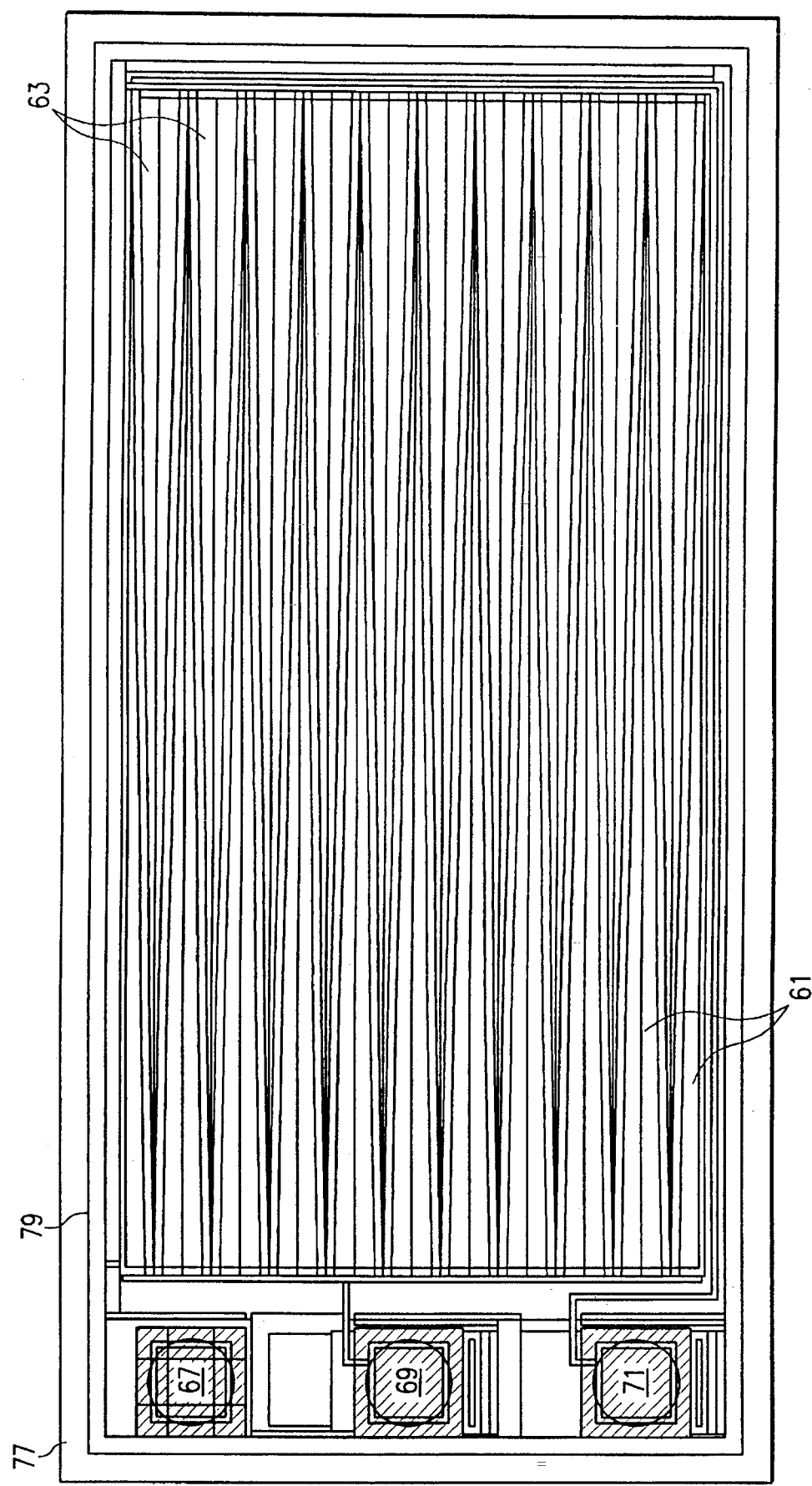
FIG. 6 depicts a plan view of a sensor circuit including a second embodiment of the device of FIG. 4.

FIG. 6 depicts a second embodiment of the integrated circuit of FIG. 5, using a twenty taper photodiode array for the photosensor. Left hand side photodiodes 61 are now coupled by a first metal bus to bond pad 69. Right hand side photodiodes 63 are interdigitated with the left hand side photodiodes 61 and spaced apart from them a minimal distance. Right hand side photodiodes 63 are coupled together and to bond pad 71. Common bond pad 67 is coupled to a first level metal bus that runs around the edge of the photosensor and is coupled to the substrate. Edge 79 is a first, second or third level metal layer that forms an opaque light barrier to prevent unwanted photons from generating additional carriers in the substrate. Similarly, a light barrier of a metal layer is formed covering the spacing between the left and right hand photodiodes, as before, to prevent unwanted carriers from being injected into the substrate. Area 77 is the scribe line area and includes a dummy n well which collects carders outside the photosensor area and is coupled to the substrate to prevent carriers from migrating into the photosensor area and causing errors.

In operation, the embodiment shown in FIG. 6 again operates as the embodiment of FIG. 5. However, by increasing the number of photodiodes which are each of a smaller size, the resolution of the sensor is increased, so the position of a smaller light spot can be accurately measured. There is a design trade off between the number of tapered photodiodes and the drive strength of the current produced by the photosensor. In the embodiment of FIG. 6, additional tapers are used and more of the area of the photosensor is contained in the space between the photodiodes, which is covered with an opaque material and therefore unavailable to collect light. As a result, the total current produced by an incident light spot is reduced. Using the photosensor of FIG. 5 instead increases the amount of sensor area which is part of a photodiode, and therefore increases the current produced by an incident light spot. However, the arrangement of FIG. 5 requires a larger minimum spot size, that is the resolution is less than the arrangement of FIG. 6. As the number of tapered photodiodes used in a particular sensor increases, the area available to produce current decreases. Eventually, the device becomes impractical. Both of the embodiments of FIG. 5 and FIG. 6 will produce good results. Other arrangements are possible, with the design trade off between resolution and current output being made in light of the requirements of a particular application.

Figure 7:
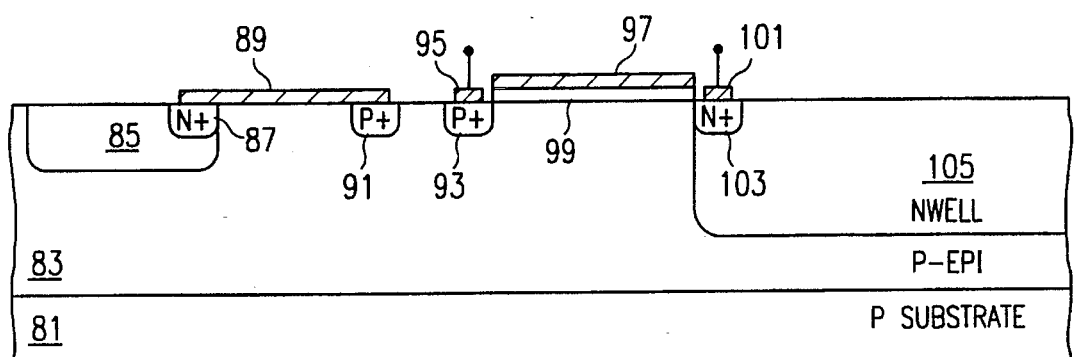
FIG. 7 depicts in cross section a scribe line area of the sensor integrated circuits of FIGS. 5 and 6.

FIG. 7 depicts the use of the dummy photodiode to collect unwanted photons in the scribe line areas of the photosensor ICs. A cross section of a photodiode 105 is shown, including a contact 101 and contacting region 103 for the current output, a contact 95 and contacting region 93 to contact the epitaxial layer 83, the substrate 81, a contacting region 91 and a first metal coupling bus 89 coupling dummy photodiode 85 through contacting region 87, an isolation oxide 99 and a metal masking region 97.

In producing a number of photosensor IC's on a single wafer, it is necessary to separate them with scribe line regions which are used to cut the devices apart in a sawing operation. No metal may be used in the scribe areas, because the sawing operation would produce unwanted metal particles that could result in shorting defects. The scribe line region therefore exposes the substrate to light, and if left alone would result in unwanted carriers being generated in the scribe line region. These carriers will migrate into the photosensor and produce erroneous current. The use of the dummy photodiode 85 eliminates this erroneous current by collecting the unwanted carriers generated in the scribe line. The dummy photodiode current is coupled to the substrate through first metal bus 89. Metal mask 97 acts as a light shield to block light from the unused area between the bond pads, and from areas that are not part of active photodiode regions.

Figure 8:
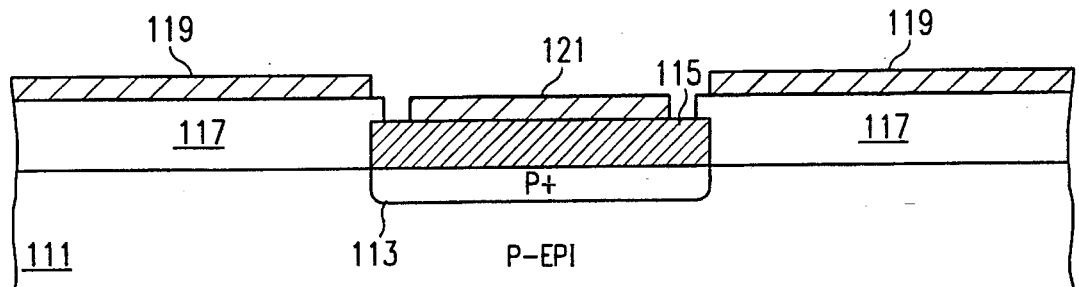
FIG. 8 depicts in cross section a bond pad area of the sensor integrated circuits of FIGS. 5 and 6.

FIG. 8 depicts the detail of a bond pad as used in the photosensor devices of FIGS. 5 and 6. The bond pad shown is the common terminal of the device. P epitaxial region 111 has bond pad contacting region 113 diffused into it. First metal contact 115 is formed. An isolation oxide 117 is formed and patterned to exposed first metal region 115. Preferably, second metal 121 is formed on top of the first metal contact 115. Second metal masking regions 119 are also formed over oxide 117.

The importance of the arrangement of FIG. 8 is to provide contact to the epitaxial layer 111 without introducing additional unwanted light. This is accomplished by using the second metal regions 119 and the first metal contact 115 to cover the epitaxial layer 111. The second metal regions 119 slightly overlap the first metal 115 at the edges, so that no area of substrate 111 is exposed to incoming photons. The use of this arrangement for the bond pads provides the necessary contact without creating an additional active area, which would introduce inaccuracy into the photosensor by creating unwanted carriers, which could migrate into the active area and result in erroneous current.

Figure 9:
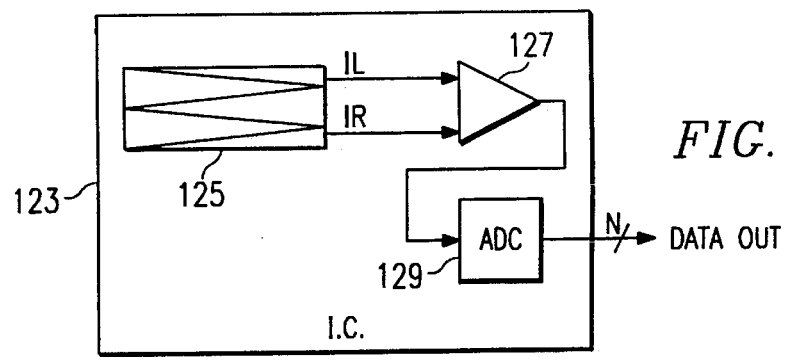
FIG. 9 depicts a block diagram of an integrated circuit including the PSD device incorporating the invention and integrating additional functions into a single CMOS integrated circuit.

FIG. 9 depicts an integrated circuit which takes advantage of the fact that the photosensor produced using the invention is compatible with CMOS or BiCMOS processing by integrating the photosensor with additional circuitry. Photosensor IC 123 includes sensor 125, analog comparator 127, analog to digital converter 129, and has digital outputs DATAOUT. Because the photosensor must receive the light spot, the package of IC 123 must have a top that will pass light through. Comparator 127, analog to digital converter 129, and any other unused silicon areas must be covered with an opaque masking metal layer to prevent the incoming light from causing erroneous current in operation. This is easily accomplished using an isolated layer of first, second or third level of metal which does not carry signal data. Other opaque materials may also be used.

Typically the output currents are compared using an analog comparator to produce an analog signal. The value of this analog comparison signal is proportional to the distance between the light spot position and one end of the photosensor. An analog to digital conversion is then performed to produce a number of bits which is a digital representation of the relative distance. The number of bits required will depend on the number of positions available in the lens system and the focusing motor used. For inexpensive systems, three or four positions may be available, so that a two bit analog to digital conversion is sufficient. For highly precise systems, four or five or more bits may be required. The integrated circuit of FIG. 9 will sense the incoming light in sensor 125, output the currents from the left and right side photodiodes as currents Il and Ir, generate an analog comparison signal proportional to the distance of the light spot from one end of the sensor in comparator 127, and convert the comparison signal to a digital value in analog-to-digital converter 129 for use by the system in focusing the lens. As integration increases and additional silicon area becomes available, additional circuitry such as an on-board processor and lens motor controller may also be included on the IC to provide a complete single chip autofocusing system.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A position sensitive device, comprising:

a semiconductor substrate;

an epitaxial layer disposed over said semiconductor substrate;

a first plurality of tapered photosensitive regions disposed over said epitaxial layer and extending from a first edge of said device towards the opposite edge of said device;

a first current output coupled to said first plurality of photosensitive regions;

a second plurality of tapered photosensitive regions disposed over said epitaxial layer and extending from said opposite edge of said device towards said first edge of said device, and being interdigitated with said first plurality of photosensitive regions;

a second current output coupled to said second plurality of said photosensitive regions; and a tortuous interface region between said first plurality of photosensitive regions and said second plurality of photosensitive regions, said interface region providing a predetermined spacing between said first and second photosensitive regions;

whereby the position of a spot of light incident on said device can be calculated from the currents present at said first and second current outputs.

2. The device of claim 1, wherein said tortuous interface region is covered with an opaque material.

3. The device of claim 1, wherein said first and second pluralities of photosensitive regions each comprise a plurality of tapered fingers, each extending across said device, each narrowing from a wide base to a narrow tip.

4. The device of claim 3, wherein the area of said first and second pluralities of photosensitive regions covered by an incident spot of light is proportional to the distance of said spot of light from said first edge and said opposite edge of said device, respectively.

5. The device of claim 4, wherein the current output at said first current output is inversely proportional to the distance the incident spot of light is from said first edge of said device.

6. The device of claim 4, wherein the current output at said second current output is inversely proportional to the distance the incident spot of light is from said opposite edge of said device.

7. The device of claim 1, wherein said semiconductor substrate and said epitaxial layers comprise material of a first conductivity type, and said first and second pluralities of photosensitive regions comprise material of a second semiconductor conductivity type.

8. An integrated circuit photosensor device, comprising:
   a bond pad for receiving a common input;
   a first current output bond pad;
   a second current output bond pad;
   a semiconductor substrate;
   an epitaxial layer overlying said semiconductor substrate;
   a first plurality of tapered photosensitive regions overlying said epitaxial layer and having the broad ends of the tapers placed at a first edge of said photosensor device and extending towards the opposite edge, said first plurality of tapered photosensitive regions being coupled together and to said first current output bond pad; and
   a second plurality of tapered photosensitive regions overlying said epitaxial layer and having the broad ends of the tapers placed at said opposite edge of said photosensor device and extending towards the first edge, said second plurality of tapered photosensitive regions being coupled together and to said second current output bond pad, said second plurality of tapered photosensitive regions and said first plurality of tapered photosensitive regions being interdigitated;
   whereby the linear position of a spot of light incident on said photosensor integrated circuit from each of said first and opposite edges of said photosensor integrated circuit may be calculated by comparing the current output at said first current output to the current output at said second current output.

9. The integrated circuit of claim 8, and also including an interface region disposed between said first plurality of tapered photosensitive regions and said second plurality of tapered photosensitive regions, wherein said interface region comprises a zigzag shaped region.

10. The integrated circuit of claim 9, wherein said first current output bond pad, said second current output bond pad, said common bond pad, and said interface region are all covered with an opaque material.

11. The integrated circuit of claim 10, wherein any exposed regions of said photosensor integrated circuit outside of the first plurality of said tapered photosensitive regions and the second plurality of said tapered photosensitive regions are covered with an opaque material.

12. The integrated circuit of claim 11, wherein said opaque material is a metal layer.

13. The integrated circuit of claim 8, and further comprising a scribe line region at the outer edges of said integrated circuit wherein said scribe line region comprises:
   a photosensitive region
   a first contacting region disposed within said photosensitive region;
   a second contacting region coupled to a semiconductor substrate;
   first and second metal contact regions overlying said first and second contacting regions, respectively; and
   an opaque conductor coupling said first metal contact region to said second contacting region;
   whereby current due to electrons caused by light incident on said scribe line region is coupled to said substrate.

14. A semiconductor wafer having an array of photosensor devices thereon and a matrix of scribe lines separating said devices, wherein said wafer also includes a dummy photodiode in a scribe line area, for the purpose of collecting unwanted carriers generated in the scribe line area.

* * * * *